United States Patent
Yeh

(10) Patent No.: US 10,474,530 B2
(45) Date of Patent: Nov. 12, 2019

(54) DATA STORAGE METHOD FOR DETECTING DATA STORAGE DEVICE AND ITS DATA STORAGE DEVICE

(71) Applicant: Silicon Motion, Inc., Jhubei, Hsinchu County (TW)

(72) Inventor: Tai-Hao Yeh, Kaohsiung (TW)

(73) Assignee: SILICON MOTION, INC., Jhubei, Hsinchu County (TW)

( * ) Notice: Subject to any disclaimer, the term of this patent is extended or adjusted under 35 U.S.C. 154(b) by 89 days.

(21) Appl. No.: 15/863,893

(22) Filed: Jan. 6, 2018

(65) Prior Publication Data

US 2019/0065308 A1 Feb. 28, 2019

(30) Foreign Application Priority Data

Aug. 28, 2017 (TW) .............................. 106129149 A

(51) Int. Cl.
*G06F 11/10* (2006.01)
*G06F 3/06* (2006.01)
*G11C 29/52* (2006.01)
*G11C 29/04* (2006.01)

(52) U.S. Cl.
CPC ........ *G06F 11/1068* (2013.01); *G06F 3/0619* (2013.01); *G06F 3/0658* (2013.01); *G06F 3/0679* (2013.01); *G11C 29/52* (2013.01); *G11C 2029/0409* (2013.01); *G11C 2029/0411* (2013.01)

(58) Field of Classification Search
CPC .. G06F 11/1068; G06F 3/0619; G06F 3/0658; G06F 3/0679; G11C 29/42; G11C 29/52; G11C 2029/0409; G11C 2029/0411

USPC ............... 714/764, 766, 768, 769, 773, 799; 365/200, 201, 185.09

See application file for complete search history.

(56) References Cited

U.S. PATENT DOCUMENTS

| | | | |
|---|---|---|---|
| 8,341,332 B2 | 12/2012 | Ma et al. | |
| 8,443,136 B2 * | 5/2013 | Frost | G06F 11/1044 711/103 |
| 9,009,566 B2 * | 4/2015 | Hung | G06F 11/1048 714/764 |
| 9,443,616 B2 * | 9/2016 | Chen | G11C 29/26 |
| 9,595,352 B2 * | 3/2017 | Chen | G11C 29/44 |
| 9,786,379 B2 | 10/2017 | Hsieh et al. | |

(Continued)

FOREIGN PATENT DOCUMENTS

| CN | 101644995 A | 2/2010 |
|---|---|---|
| CN | 103218274 A | 7/2013 |

(Continued)

*Primary Examiner* — John J Tabone, Jr.
(74) *Attorney, Agent, or Firm* — McClure, Qualey & Rodack, LLP

(57) ABSTRACT

A data storage device includes a flash memory and a controller. The flash memory includes a plurality of planes, and each of the planes includes a plurality of blocks. Each of the blocks includes a plurality of pages. The size of each page is N K-bytes, wherein N is a positive integer greater than 1. The controller is coupled to the flash memory to calculate the ECC bit number of each page using a detection unit of 1 Kbyte. The controller statistically calculates the number of detection units of the pages corresponding to different values of the ECC bit number in order to determine whether each plane of the flash memory is normal or not.

14 Claims, 5 Drawing Sheets

(56) References Cited

U.S. PATENT DOCUMENTS

| | | | |
|---|---|---|---|
| 9,996,417 B2 * | 6/2018 | Shappir | G06F 11/108 |
| 10,176,886 B1 * | 1/2019 | Spencer | G11C 29/52 |
| 2013/0205183 A1 | 8/2013 | Fillingim et al. | |
| 2014/0192583 A1 * | 7/2014 | Rajan | G11C 7/10 |
| | | | 365/63 |
| 2015/0287478 A1 * | 10/2015 | Chen | G11C 29/26 |
| | | | 714/719 |
| 2016/0139982 A1 | 5/2016 | Yu et al. | |
| 2016/0259675 A1 * | 9/2016 | Ninose | G11C 29/76 |
| 2017/0077962 A1 | 3/2017 | Yang | |
| 2018/0011637 A1 * | 1/2018 | Yeh | G06F 3/0604 |
| 2019/0065055 A1 * | 2/2019 | Lin | G06F 3/061 |

FOREIGN PATENT DOCUMENTS

| | | |
|---|---|---|
| TW | 201411633 A | 3/2014 |
| TW | 201526013 A | 7/2015 |
| TW | 201710893 A | 3/2017 |
| TW | 201714094 A | 4/2017 |
| TW | I594126 B | 8/2017 |

\* cited by examiner though the data will eventually cannot be read or written normally.
DATA STORAGE METHOD FOR DETECTING DATA STORAGE DEVICE AND ITS DATA STORAGE DEVICE

CROSS REFERENCE TO RELATED APPLICATIONS

This Application claims priority of Taiwan Patent Application No. 106129149 filed on Aug. 28, 2017, the entirety of which is incorporated by reference herein.

BACKGROUND OF THE INVENTION

Field of the Invention

The disclosure generally relates to a data storage device and a data storage method for inspecting the data storage device, and more particularly, to a data storage device and a data storage method which calculates the number of different error-correction-code values using a statistical method.

Description of the Related Art

Flash memory is a general non-volatile data storage device, which is utilized for erasing and programming electrically. For example, NAND flash may be utilized in a memory card, a USB flash device, SSD, eMMC or UFS.

Because flash memory has many data blocks which can become damaged after long-term use, the data will become invalid and eventually cannot be read or written normally. Therefore, what is needed is an effective data storage method to rapidly and conveniently inspect whether the data storage device is normal or damaged in order to confirm the performance and reliability of accessing data.

BRIEF SUMMARY OF THE INVENTION

In order to solve the aforementioned problem, the invention proposes a data storage device and a data storage method to detect the data storage device. The number of detection units of a plurality of pages corresponding to different error correction code (ECC) bit values can be statistically calculated. Accordingly, whether the data storage device is damaged or not can be detected by determining whether or not the above number is greater than a ratio. In addition, a table is utilized by the present invention to record the above number and its ratio in order to avoid taking up too much storage space. Therefore, the performance and reliability of accessing data can be confirmed.

In one aspect of the invention, the present invention provides a data storage device which includes a flash memory and a controller. The flash memory includes a plurality of storage planes. Each of the storage planes comprises a plurality of blocks, each of the blocks comprises a plurality of pages, and the size of each of the pages is N Kbytes. N is a positive integer greater than one. The controller is coupled to the flash memory. The controller is configured to calculate the error correction code (ECC) bit value of each page using a detection unit of 1 Kbyte, and to statistically calculate the number of detection units of the pages corresponding to different ECC bit values in order to determine whether or not each storage plane of the flash memory is normal.

In another aspect of the invention, the present invention provides a data storage method utilized for optimizing a data storage device. The data storage device includes a flash memory, a controller and a RAM. The flash memory comprises a plurality of storage planes, and each of the storage planes comprises a plurality of blocks. In addition, each of the blocks comprises a plurality of pages. The size of each of the pages is N Kbytes, wherein N is a positive integer greater than one. The data storage method includes: calculating the error correction code (ECC) bit value of each page using a detection unit of 1 Kbyte; and statistically calculating the number of detection units of the pages corresponding to different ECC bit values in order to determine whether each storage plane of the flash memory is normal or not.

BRIEF DESCRIPTION OF DRAWINGS

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF THE INVENTION

Figure 1:
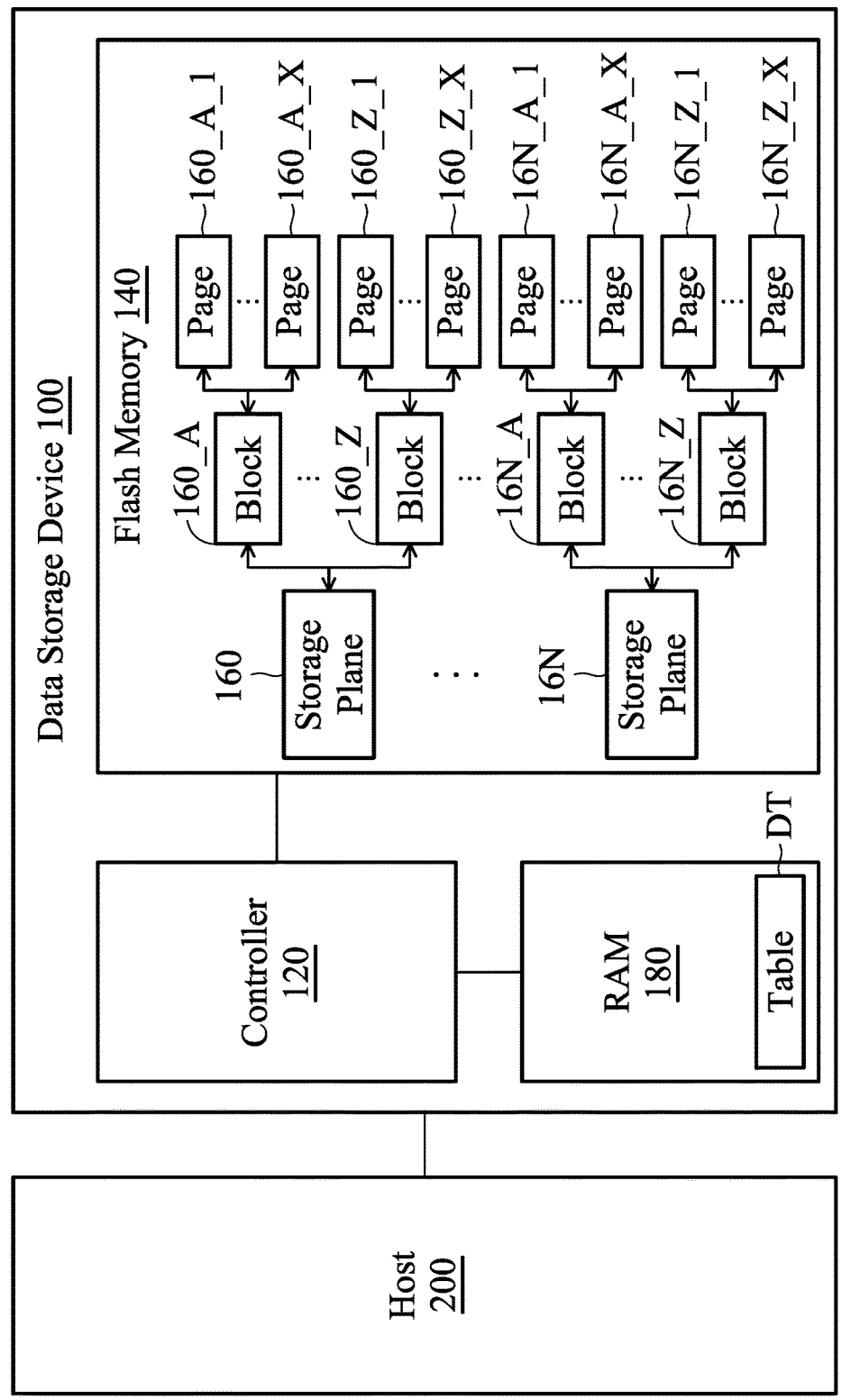
FIG. 1 is a schematic diagram of a data storage device and a host according to an embodiment of the invention.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a schematic diagram of a data storage device 100 and a host 200 according to an embodiment of the invention. In one embodiment, the data storage device 100 includes a controller 120, a flash memory 140 and a random access memory (RAM) 180. The data storage device 100 is coupled to the host 200 to transmit data and command or to receive data and command. The flash memory 140 can be non-volatile memory such as NAND flash. The data storage device 100 may include (but not limit to): a portable storage device (such as memory card complying with the standards of SD/MMC, CF, MS, XD or UFS), a solid state drive (SSD) and various kinds of embedded storage devices (such as embedded storage devices complying with the UFS or EMMC standards). The host 200 can be any one of various kinds of electronic devices, such as a cell phone, a tablet computer, a laptop computer, a navigating apparatus, a car system, or a processor inside one of the electronic devices listed above.

As shown in FIG. 1, the controller 120 is coupled to the flash memory 140 and the RAM 180. The RAM 180 is utilized to temporarily store and cache data that is needed by the controller 120, or to temporarily store data that will be written to the flash memory 140 by the host 200 in order to facilitate timely access to the data storage device 100. The controller 120 performs a read operation on the flash memory 140 by controlling the flash memory 140 with the unit of a cluster. In addition, the controller 120 is coupled to the flash memory 140 to transmit data and instructions or to receive data and instructions mutually. Furthermore, the controller 120 can be a read-only-memory (ROM) and a micro-controller with firmware code, and the micro-controller executes the firmware code to operate or access the flash memory 140.

The flash memory 140 includes a plurality of planes 160~16N. In one embodiment, a portion of each storage plane 160~16N constitutes a super block, and the flash memory 140 includes a plurality of super blocks. Specifically, each of the super blocks 160~16N includes a plurality of blocks. In another embodiment, the plane is the super block. For example, the flash memory 140 has four super blocks (CE0~CE3). The storage plane 160 includes the blocks 160_A~160_Z, and the storage plane 16N includes the blocks 16N_A~16N_Z. Regarding the storage plane 160, each of the blocks 160_A~160_Z further includes a plurality of pages. The block 160_A includes the pages 160_A_1~160_A_X, and the block 160_Z includes the pages 160_Z_1~160_Z_X. The size of each page is N bytes, wherein N is a positive integer greater than one.

For example, each of the storage planes 160~164 includes 820 blocks, and each of the blocks includes 256 pages. The size of each page is 16 KBytes. In addition, the pages 160_A_1~16N_Z_X are physical pages. When the controller 120 performs a write operation or a programming operation on the flash memory 140, it controls the flash memory 140 to perform the write or programming operation with the unit of a physical page.

Regarding the flash memory 140, each of the pages 160_A_1~16N_Z_X has a different physical address. In other words, each of the pages 160_A_1~16N_Z_X has a physical address, and each physical address of the pages 160_A_1~16N_Z_X is different. When a write operation is executed by the data storage device 100, the controller 120 determines the physical address of the flash memory 140 for writing or storing the data. In addition, the physical addresses are mapped to a plurality of respective logical addresses by the controller 120. Therefore, regarding the host 200, the host 200 reads or writes data which is stored in a logical address by the data storage device 100 through the logical address.

In one embodiment, the controller 120 calculates the error correction code (ECC) bit value of each page 160_A_1~16N_Z_X in detection segments of 1 byte. The controller 120 also statistically calculates the number of detection segments of the corresponding pages for different ECC bit values, therefore, whether or not each storage plane 160-16N of the flash memory is normal can be determined.

Figure 2:
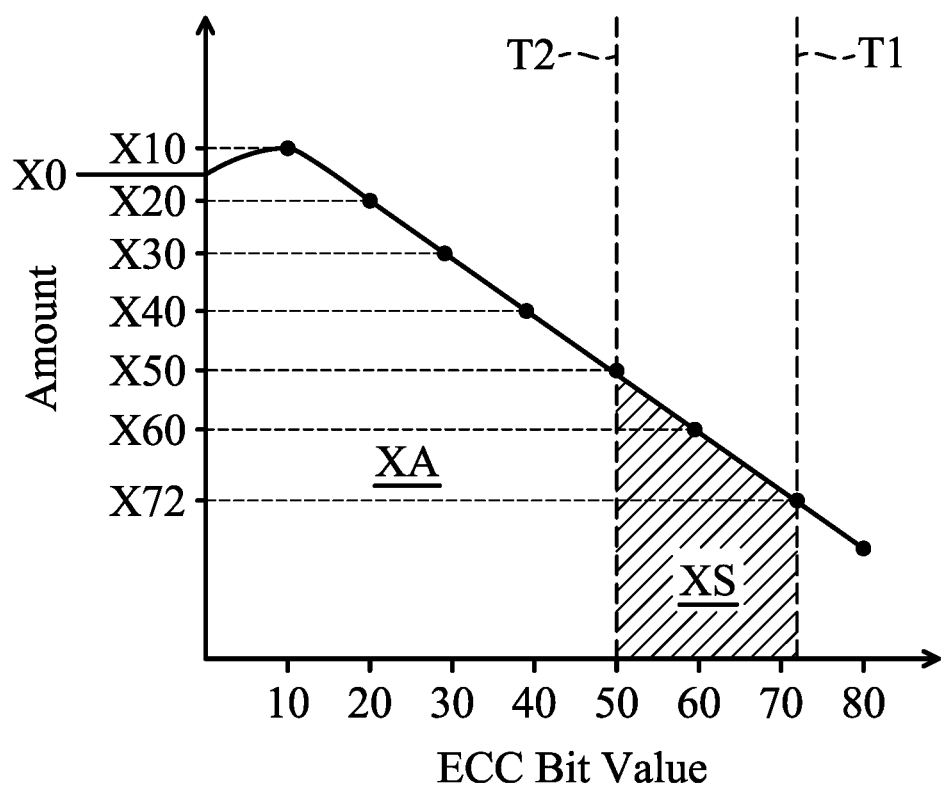
FIG. 2 is a statistical diagram illustrating the amounts of different error-correction-code values according to an embodiment of the invention.

FIG. 2 is a statistical diagram illustrating the amounts of different error-correction-code values according to an embodiment of the invention. For example, the flash memory 140 includes 4 storage planes 160~163. Each storage plane includes 820 blocks. Each block includes 256 pages, and the size of each page is 16 KBytes. Specifically, the controller 120 inspects the flash memory 140 by utilizing detection segments of 1 KByte, and it generates the ECC bit value accordingly. Within the detection segment of 1 KByte, if the ECC bit value exceeds a first predetermined value T1, the controller 120 determines that the block where the page belongs is a damaged block.

Specifically, the controller 120 calculates the amounts of detection segments corresponding to different ECC bit values. As shown in FIG. 2, the number of detection segments is X0 when the ECC bit value is 0 bit, the number of detection segments is X1 when the ECC bit value is 1 bit (not shown), the number of detection segments is X10 when the ECC bit value is 10 bit, and the number of detection segments is X20 when the ECC bit value is 20 bit, and so on. By utilizing the calculation method, the statistical diagram of FIG. 2 can be obtained by the controller 120.

It should be noted that the aforementioned detection segment of 1 KByte is used for illustration, not for limiting the present invention. In some embodiments, the detection segment can be increased (such as 2 KBytes or 4 KBytes). Therefore, the ground number of different ECC bit values of the statistical diagram will be decreased, and the inspection speed will be improved.

In addition, the controller 120 can statistically calculate respectively for each storage planes 160~163, or statistically calculate all storage planes 160~163. When the controller 120 statistically calculates each storage planes 160~163 respectively, four statistical diagrams can be obtained respectively corresponding to the four storage planes. For example, FIG. 2 is the statistical diagram of the storage plane 160 of the flash memory 140. In the embodiment, the storage plane 160 includes 820*256*16 (i.e., 3,358,720) detection segments. Therefore, the summation of the amount X0, X1 . . . Xn is 3,358,720. When the controller 120 statistic all of the storage planes 160~163, there will be 4*820*256*16 (i.e., 13,434,880) detection segments for the 4 storage planes. In other words, the summation of the amount X0, X1 . . . Xn is 13,434,880.

In the embodiment of FIG. 2, the first predetermined value T1 is 72 bit. When the ECC bit value of a detection segment is greater than 72 bits, the controller 120 determines that the block which corresponds to the detection segment is the uncorrectable error correction code (UECC). In other words, the block is a damaged block. In another embodiment, if the ECC bit value of a detection segment is greater than 72 bits, the controller 120 determines that the logical plane which corresponds to the detection segment is a damaged logical plane.

In addition, the controller 120 further defines a second predetermined value T2, and the second predetermined value T2 is lower than the first predetermined value T1. Specifically, the second predetermined value T2 is 60% to 80% of the first predetermined value T1. For example, the second predetermined value T2 is 70% of the first predetermined value T1. In one embodiment, the controller 120 performs calculation by dividing the total number of all detection segments of the logical plane by the number of detection segments in which the ECC bit value is greater than the second predetermined value T2, and a ratio may be obtained accordingly. However, there are very few detection segments in which the ECC bit value is greater than the first predetermined value T1, it could be ignored for the statistical calculation. Therefore, in another embodiment, the controller 120 performs the calculation by dividing the total number of all detection segments of the logical plane (the area XA of FIG. 2) by the number of detection segments in which the ECC bit value is greater than the second predetermined value T2 and lower than the first predetermined value T1 (the area XS of FIG. 2), and the ratio can be obtained accordingly.

In one embodiment, the controller 120 determines whether or not the above ratio is greater than a predetermined ratio. If the above ratio is greater than the predetermined ratio, the controller 120 determines that the storage plane is a damaged storage plane. If the above ratio is lower than or equal to the predetermined ratio, the controller 120 determines that the storage plane is a normal storage plane. For example, the predetermined ratio is about 20%. Afterwards, a table is stored by the RAM 180 to record the ratio of each storage plane. Because only the ratio is recorded by the table, the storage capacity required by the table is very small, and the performance of the data storage device 100 will not be affected. The table of the RAM 180 can be quickly read by the controller 120 to detect whether or not the flash memory 140 is damaged.

Figure 3:
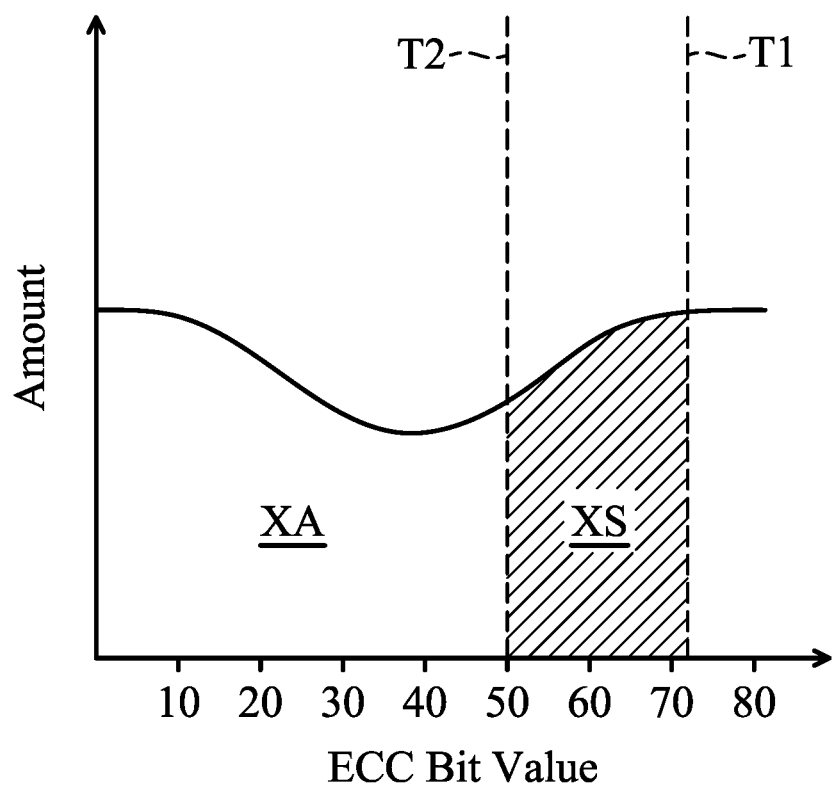
FIG. 3 is a statistical diagram illustrating the amounts of different error-correction-code values according to another embodiment of the invention.

FIG. 3 is a statistical diagram illustrating the number of different ECC bit values according to another embodiment of the invention. In the embodiment, the ratio calculated from the statistical diagram (i.e., the rear XA divided by the area XS) is greater than the predetermined ratio. Therefore, the controller 120 determines that the flash memory 140 has been damaged. Afterwards, the data stored by the damaged storage plane is transferred to another normal storage plane by the controller 120. In other words, the data is re-written to another storage plane to store the data properly. In another embodiment, if the controller 120 determines that there is damage for the flash memory 140, the controller 120 adjusts the read voltage used for reading the damaged storage plane in order to execute the read retry.

It should be noted that the controller 120 can initiatively or passively transmit the ratio to the host 200. In another embodiment, the ratio is transmitted to the host 200 periodically and initiatively by the controller 120. Furthermore, in another embodiment, when the host 200 transmits an inquiry command to the data storage device 100, the controller 120 transmits the ratio to the host 200 for responding the inquiry command of the host 200.

As such, the present invention provides a data storage method which calculates the amounts of different ECC bit values and obtains a ratio accordingly in order to determine whether the flash memory 140 is damaged or not. Therefore, compared with the traditional method of taking a single value of an erase count as the determination standard, the ratio provided by the present invention is more reliable and accurate because it is generated from statistically calculating various values corresponding to different ECC bit values.

Figure 4:
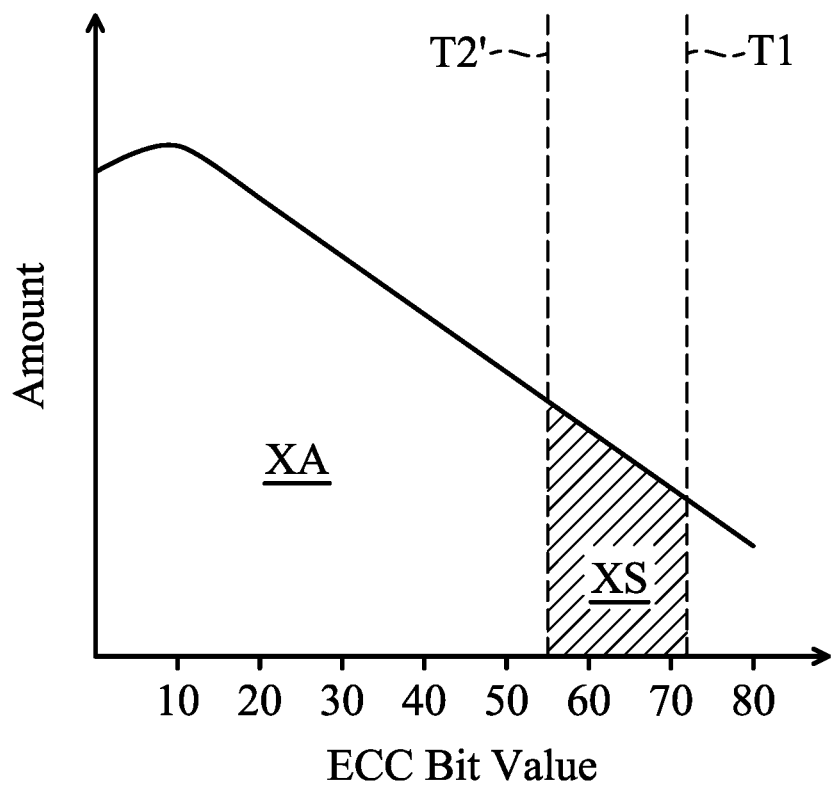
FIG. 4 is a statistical diagram illustrating the amounts of different error-correction-code values according to another embodiment of the invention.

In addition, the second predetermined value can also be adjusted based on the usage status of the data storage device 100. FIG. 4 is a statistical diagram illustrating the amounts of different ECC bit values according to another embodiment of the invention. In the embodiment, the second predetermined value T2' is 80% of the first predetermined value T1'. In other words, the second predetermined value T2' is greater than the second predetermined value T2 of FIG. 2. For example, the second predetermined value T2' is proportional to the temperature. When the data storage device 100 is used in an environment of high temperature, the data is more likely to be damaged. Therefore, it can be adjusted to a higher value of the second predetermined value T2'.

Figure 5:
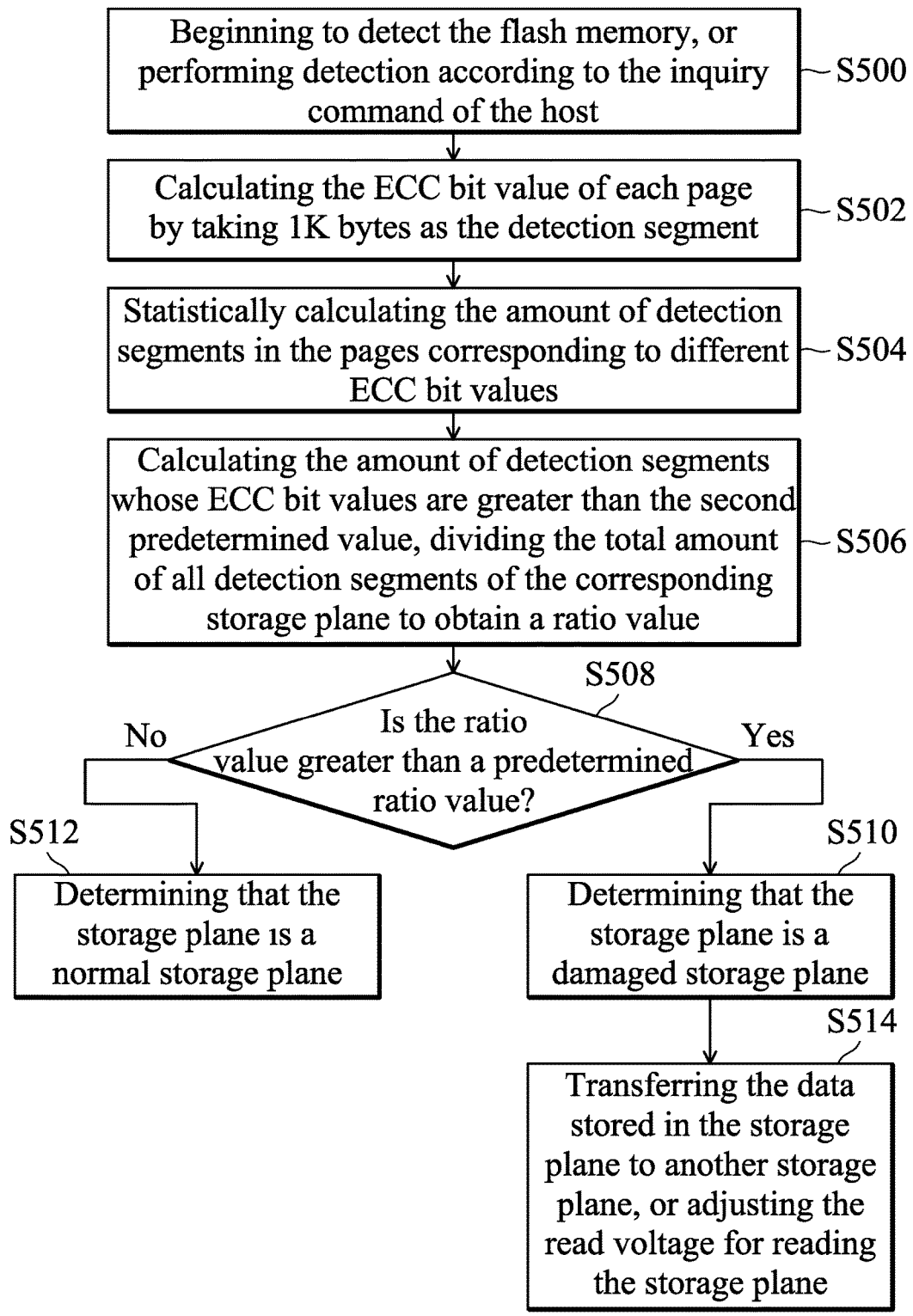
FIG. 5 is a flowchart illustrating the data storage method according to an embodiment of the invention.

FIG. 5 is a flowchart illustrating the data storage method according to an embodiment of the invention. In step S500, the controller 120 begins to detect the flash memory 140, or performs detection according to the inquiry command of the host 200. In step S502, the controller 120 calculates the ECC bit value of each page by taking 1 Kbytes as the detection segment. In step S504, the controller 120 statistically calculates the number of detection segments of pages corresponding to different ECC bit values. The statistical results are illustrated in FIG. 2 to FIG. 4, and will not be repeated again.

Afterwards, in step S506, the controller 120 calculates a first number of detection segments whose ECC bit values are greater than the second predetermined value T2, and it divides the first number by the total number of all detection segments of the corresponding storage plane to obtain a ratio. In step S508, the controller 120 determines whether the ratio is greater than a predetermined ratio or not.

If the above ratio is not greater than the predetermined ratio, step S512 will be executed so that the controller 120 determines that the storage plane is a normal storage plane. If the above ratio is greater than the predetermined ratio, step S510 will be executed so that the controller 120 determines that the storage plane is a damaged storage plane. Afterwards, in step S514, the controller 120 transfers the data stored in the storage plane to another storage plane, or it adjusts the read voltage used for reading the storage plane.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name to distinguish the claim elements. While the invention has been described by way of example and in terms of the preferred embodiments, it should be understood that the invention is not limited to the disclosed embodiments. On the contrary, it is intended to cover various modifications and similar arrangements. Therefore, the scope of the appended claims should be accorded the broadest interpretation so as to encompass all such modifications and similar arrangements.

What is claimed is:

1. A data storage device, comprising:
a flash memory, comprising a plurality of storage planes, wherein each of the storage planes comprises a plurality of blocks, each of the blocks comprises a plurality of pages, each of the pages has a size of N Kbytes, wherein N is a positive integer greater than one; and
a controller, coupled to the flash memory, configured to calculate an error correction code (ECC) bit value of each page using a plurality of detection segments for detecting the flash memory, wherein each detection segment has a size of 1 Kbytes, and the controller is further configured to statistically calculate a number of the detection segments in the pages corresponding to different ECC bit values in order to determine whether each storage plane of the flash memory is normal or not,
wherein in response to the ECC bit value of a specific detection segment in a specific block being greater than a first predetermined value, the controller determines that the specific block is a damaged block,
wherein the controller calculates a first number of the detection segments in the pages in each storage plane that have the ECC bit values between the first predetermined value and a second predetermined value, and the second predetermined value is smaller than the first predetermined value, wherein the controller divides the first number by a total number of the detection segments in each storage plane obtain a ratio, wherein in response to the ratio corresponding to a specific storage plane among the storage planes being greater than a predetermined ratio, the controller determines that the specific storage plane is damaged.

2. The data storage device as claimed in claim 1, wherein: the second predetermined value is 60% to 80% of the first predetermined value.

3. The data storage device as claimed in claim 1, wherein: the data storage device further comprises a random-access memory (RAM) to store a table which records the ratio of each storage plane.

4. The data storage device as claimed in claim 1, wherein: the data storage device is coupled to a host, and the controller transmits the ratio periodically to the host.

5. The data storage device as claimed in claim 1, wherein: the data storage device is coupled to a host, and when the host transmits an inquiry command to the data storage device, the controller transmits the ratio periodically to the host.

6. The data storage device as claimed in claim 1, wherein: when the controller determines that the specific storage plane is a damaged storage plane, the controller transfers data stored in the specific storage plane to another storage plane.

7. The data storage device as claimed in claim 1, wherein: when the controller determines that the specific storage plane is a damaged storage plane, the controller adjusts a read voltage used for reading the specific storage plane.

8. A data storage method for optimizing the data storage device, wherein the data storage device comprises a flash memory, a controller and a random access memory (RAM), and the flash memory comprises a plurality of storage planes, wherein each of the storage planes comprises a plurality of blocks, each of the blocks comprises a plurality of pages, a size of each of the pages is N Kbytes, wherein N is a positive integer greater than one, the data storage method comprising:

calculating an error correction code (ECC) bit value of each page using a plurality of detection segments for detecting the flash memory, wherein each detection segment has a size of 1 Kbyte;

statistically calculating a number of the detection segments in the pages corresponding to different ECC bit values in order to determine whether each storage plane of the flash memory is normal or not;

in response to the ECC bit value of a specific detection segment in a specific block being greater than a first predetermined value, determining that the specific block is a damaged block;

calculating a first number of the detection segments in the pages in each storage plane that have the ECC bit values between the first predetermined value and a second predetermined value, wherein the second predetermined value is smaller than the first predetermined value;

dividing the first number by a total number of the detection segments in each storage plane obtain a ratio; and in response to the ratio corresponding to a specific storage plane among the storage planes being greater than a predetermined ratio, determining that the specific storage plane is damaged.

9. The data storage method as claimed in claim 8, wherein:
the second predetermined value is 60% to 80% of the first predetermined value.

10. The data storage method as claimed in claim 8, further comprising:
storing a table which records the ratio of each storage plane.

11. The data storage method as claimed in claim 8, wherein:
the data storage device is coupled to a host, and the method further comprises: periodically transmitting the ratio to the host.

12. The data storage method as claimed in claim 8, wherein:
the data storage device is coupled to a host, and the method further comprises:
when the host transmits an inquiry command to the data storage device, periodically transmitting the ratio to the host.

13. The data storage method as claimed in claim 8, wherein:
in response to determining that the specific storage plane is a damaged storage plane, transferring data stored in the specific storage plane to another storage plane.

14. The data storage method as claimed in claim 8, wherein:
when the controller determines that the specific storage plane is a damaged storage plane, the controller adjusts a read voltage used for reading the specific storage plane.

* * * * *